(12) United States Patent
Xie et al.

(10) Patent No.: US 8,595,597 B2
(45) Date of Patent: Nov. 26, 2013

(54) ADJUSTABLE PROGRAMMING SPEED FOR NAND MEMORY DEVICES

(75) Inventors: Ningde Xie, Hillsboro, OR (US);
Matthew Goldman, Folsom, CA (US);
Jawad B. Khan, Cornelius, OR (US);
Robert W. Faber, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 344 days.

(21) Appl. No.: 13/039,553

(22) Filed: Mar. 3, 2011

(65) Prior Publication Data
US 2012/0226959 A1  Sep. 6, 2012

(51) Int. Cl.
*G11C 29/00* (2006.01)
*G06F 11/00* (2006.01)

(52) U.S. Cl.
USPC .......................................... 714/773; 714/708

(58) Field of Classification Search
USPC .................................................. 714/773, 708
See application file for complete search history.

(56) References Cited

U.S. PATENT DOCUMENTS

| | | | | |
|---|---|---|---|---|
| 5,657,292 | A * | 8/1997 | McClure | 365/233.16 |
| 5,808,960 | A * | 9/1998 | McClure | 365/233.16 |
| 6,249,562 | B1 * | 6/2001 | Wells | 377/26 |
| 6,768,676 | B2 * | 7/2004 | Hirano | 365/185.18 |
| 7,107,498 | B1 * | 9/2006 | Schmidt et al. | 714/704 |
| 7,114,659 | B2 * | 10/2006 | Harari et al. | 235/492 |
| 7,352,630 | B2 * | 4/2008 | Lee et al. | 365/185.22 |
| 7,460,398 | B1 * | 12/2008 | Roohparvar et al. | 365/185.03 |
| 7,577,034 | B2 * | 8/2009 | Lee et al. | 365/185.19 |
| 7,630,246 | B2 * | 12/2009 | Roohparvar | 365/185.18 |
| 7,656,710 | B1 * | 2/2010 | Wong | 365/185.19 |
| 7,900,102 | B2 * | 3/2011 | Sokolov et al. | 714/719 |
| 7,961,518 | B2 * | 6/2011 | Roohparvar | 365/185.18 |
| 8,046,645 | B2 * | 10/2011 | Hsu et al. | 714/723 |
| 2003/0067853 | A1 * | 4/2003 | Wang et al. | 369/47.39 |
| 2003/0095482 | A1 * | 5/2003 | Hung et al. | 369/47.44 |
| 2006/0104115 | A1 | 5/2006 | Chun et al. | |
| 2007/0033581 | A1 | 2/2007 | Tomlin et al. | |
| 2007/0263444 | A1 | 11/2007 | Gorobets et al. | |
| 2008/0159094 | A1 * | 7/2008 | Lin | 369/44.32 |
| 2009/0016104 | A1 * | 1/2009 | Kim | 365/185.03 |
| 2009/0080263 | A1 * | 3/2009 | Lee et al. | 365/185.19 |
| 2009/0265598 | A1 * | 10/2009 | Lasser | 714/746 |
| 2010/0046299 | A1 | 2/2010 | Roohparvar | |
| 2010/0332729 | A1 * | 12/2010 | Alrod et al. | 711/103 |
| 2011/0044113 | A1 * | 2/2011 | Kim et al. | 365/185.19 |

OTHER PUBLICATIONS

"PCT, International Search Report & Written Opinion of the International Searching Authority for Application No. PCT/US2012/024474", (Feb. 9, 2012), Whole Document.

* cited by examiner

*Primary Examiner* — Joseph D Torres
(74) *Attorney, Agent, or Firm* — Blakely, Sokoloff, Taylor & Zafman LLP

(57) ABSTRACT

Embodiments of the invention describe methods, systems and apparatuses to improve solid state device (SSD) write speed by efficiently utilizing error correction code executed for the device. SSDs may be comprised of several NAND memory devices. It is understood that such devices tend to have a raw bit error rate (RBER) that is related to the program/erase cycle count for the device.

Embodiments of the invention efficiently use system ECC by changing the operating conditions of the SSD to better utilize the robustness of the implemented ECC algorithm. For example, embodiments of the invention may alter the programming voltage supplied to an SSD to increase write speed; such an increase may increase the RBER of the device, but will not affect the accuracy of such operations due to the ECC that is provisioned for end of life storage fidelity (i.e., the RBER that will occur at the end of life).

16 Claims, 4 Drawing Sheets

ADJUSTABLE PROGRAMMING SPEED FOR NAND MEMORY DEVICES

FIELD

Embodiments of the invention generally pertain to computing devices and more particularly to storage system performance.

BACKGROUND

A solid state drive (SSD) is a data storage device that uses solid state memory to store persistent data. Said solid state memory may be comprised of NAND non-volatile flash memory units. SSDs allow for versatile and compact design for their respective host systems and perform better than hard disk drives in terms of seek times and latency due to their lack of moving parts.

The "storage fidelity" of an SSD is defined as the reliability of the data retention of its NAND memory units. SSD storage fidelity issues, in particular the presence of bit errors during read operations, tend to increase with use due to accumulated wear on the silicon from repeated program/erase cycling.

As a result, SSDs typically employ error detection and error checking code (ECC) designed to fix these bit errors and guarantee the data integrity of NAND flash devices. Such ECC algorithms are provisioned to be robust enough to handle error rates throughout the life of the SSD. Thus, because these ECC algorithms must be robust enough for "end of life" storage fidelity, they are "over-provisioned" for the "early life" storage fidelity of the SSD—i.e., when the device experiences a much smaller error rate.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Descriptions of certain details and implementations follow, including a description of the figures, which may depict some or all of the embodiments described below, as well as discussing other potential embodiments or implementations of the inventive concepts presented herein. An overview of embodiments of the invention is provided below, followed by a more detailed description with reference to the drawings.

DETAILED DESCRIPTION

Embodiments of the invention describe methods, systems and apparatuses to improve solid state device (SSD) write speed by efficiently utilizing Error Correction Code (ECC) of the device. SSDs may be comprised of several NAND flash memory device units. It is understood that such devices tend to have a raw bit error rate (RBER) that increases with respect to the program/erase cycle count (i.e., wear) of the device.

ECC is executed to correct the raw bit errors that occur. It is understood that the implemented ECC algorithm must be robust enough to handle the error rates that occur towards the "end of the life" for the SSD. If the SSD is operated in a consistent manner throughout the life of the device, it is understood that these ECC algorithms are provisioned in a manner that "over-protects" at the early-life of the SSD, when the error rate is much smaller (i.e., smaller when operated under the same conditions as the end of life).

Embodiments of the invention optimize the performance of the SSD to take advantage of the protection that is built into the system even early in the lifetime of the NAND silicon when wear issues are minimal. For example, embodiments of the invention may alter certain operating conditions to increase write speed during the early life of the device; such an increase may increase the RBER during read operations, but will not affect the reliability of such operations due to the fact that the ECC is provisioned for end of life storage fidelity (i.e., the RBER that will occur at the end of life). Thus, embodiments of the invention describe mechanisms to determine if programming speed may be increased and if so by how much. In the prior art, programming speed is fixed throughout the whole life of SSD and hence the system ECC provides unnecessarily conservative protection during the early life of the device.

Figure 1:
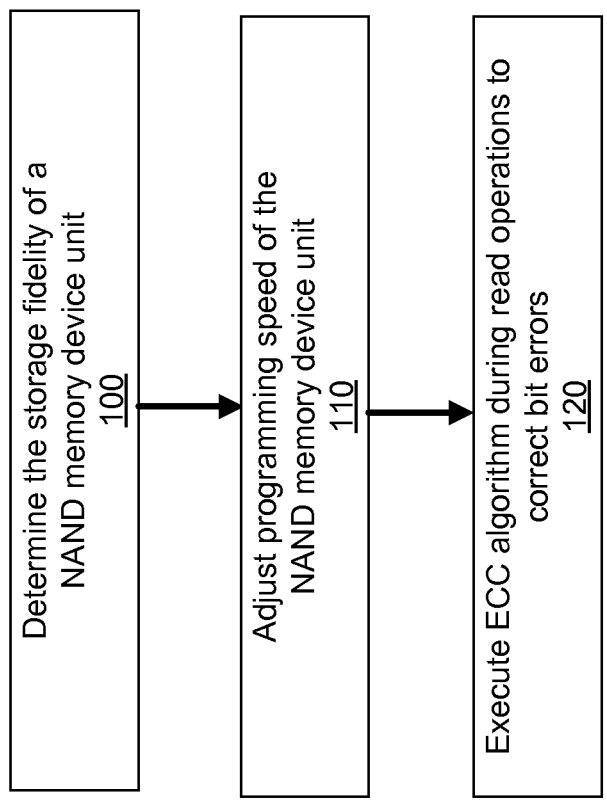
FIG. 1 is a flow chart of an embodiment of the invention.

FIG. 1 is a flow diagram illustrating an embodiment of the invention. Flow diagrams as illustrated herein provide examples of sequences of various process actions. Although shown in a particular sequence or order, unless otherwise specified, the order of the actions can be modified. Thus, the illustrated implementations should be understood only as examples, and the illustrated processes can be performed in a different order, and some actions may be performed in parallel. Additionally, one or more actions can be omitted in various embodiments of the invention; thus, not all actions are required in every implementation. Other process flows are possible.

In this embodiment, the storage fidelity of a NAND memory device unit at runtime is determined, 100. As described above, the storage fidelity of the NAND memory device unit refers to the reliability of programming operations on the device. It is understood that programming attributes may directly affect the storage fidelity of the NAND memory device e.g., the program/erase cycle history of the device. Thus, the storage fidelity of the NAND device may be determined based, at least in part, on the program/erase cycle count of the device.

It is understood that while the program/erase cycle count of the NAND memory device affects storage fidelity, other factors may cause the RBER of the device to be higher than would be expected for a specific program/erase cycle count. Under certain operating conditions, it may be more ideal to determine the storage fidelity of the NAND memory device based on the RBER of the device. Thus, in other embodiments of the invention, the programming attribute used to determine the storage fidelity of the NAND memory device as described in operation 100 is the RBER of the device. The RBER of the device may be detected, for example, by the number of corrections required during read operations.

Based on said storage fidelity, the programming speed of the NAND memory device unit is adjusted, 110. In one embodiment, a characteristic of a programming voltage (i.e., $\Delta V_{pgm}$) applied to the NAND memory device unit is adjusted in order to affect its programming speed. For example, the characteristic of the programming voltage to be adjusted may be the voltage step of $V_{pgm}$. Thus, if the program/erase cycle count or the RBER is low, the voltage step of $V_{pgm}$ may be increased by a $\Delta V_{pgm}$ value, which thereby increases the programming/write speed of the NAND memory device unit. It is to be understood that the increase in the voltage step may allow for fewer programming pulses to be used during programming operations (with respect to the case when the voltage step is not increased), thereby increasing the programming speed of the device.

In another embodiment, if the storage fidelity of the NAND memory device unit allows, programming operations may be exited before all bits have reached their target values in order to increase write performance. Thus, if the program/erase cycle count or the RBER is low, the program algorithm may be directed to exit the programming operation more quickly. It is to be understood that exiting said write operation prematurely will result in "missing bits," which are functionally equivalent to bit errors; the low amount of errors expected at the early life of the device allows for these missing bit "errors" to be corrected by the ECC algorithm provisioned for the end of life of the device (i.e., as long as the total number of errors does not exceed the expected error rate at the end of life of the device).

Said ECC algorithm is executed to correct the above described bit errors during read operations of the NAND memory device, 120. Thus, in this embodiment the programming speed is increased during the early life of the device. In one of the example embodiments described above, an increased voltage step for Vpgm will cause the NAND memory device to program at a higher speed, which may result in an increased RBER. In another example described above, a change to the program exit criteria will cause the NAND memory device to exit the program operation earlier; however, the executed ECC algorithm is provisioned to handle the increased RBER that occurs towards the end-of-life of the NAND memory device, so the reliability of the data retrieved from read operations—i.e., the storage fidelity of the NAND memory device, will not be compromised when programming speed is increased.

Figure 2:
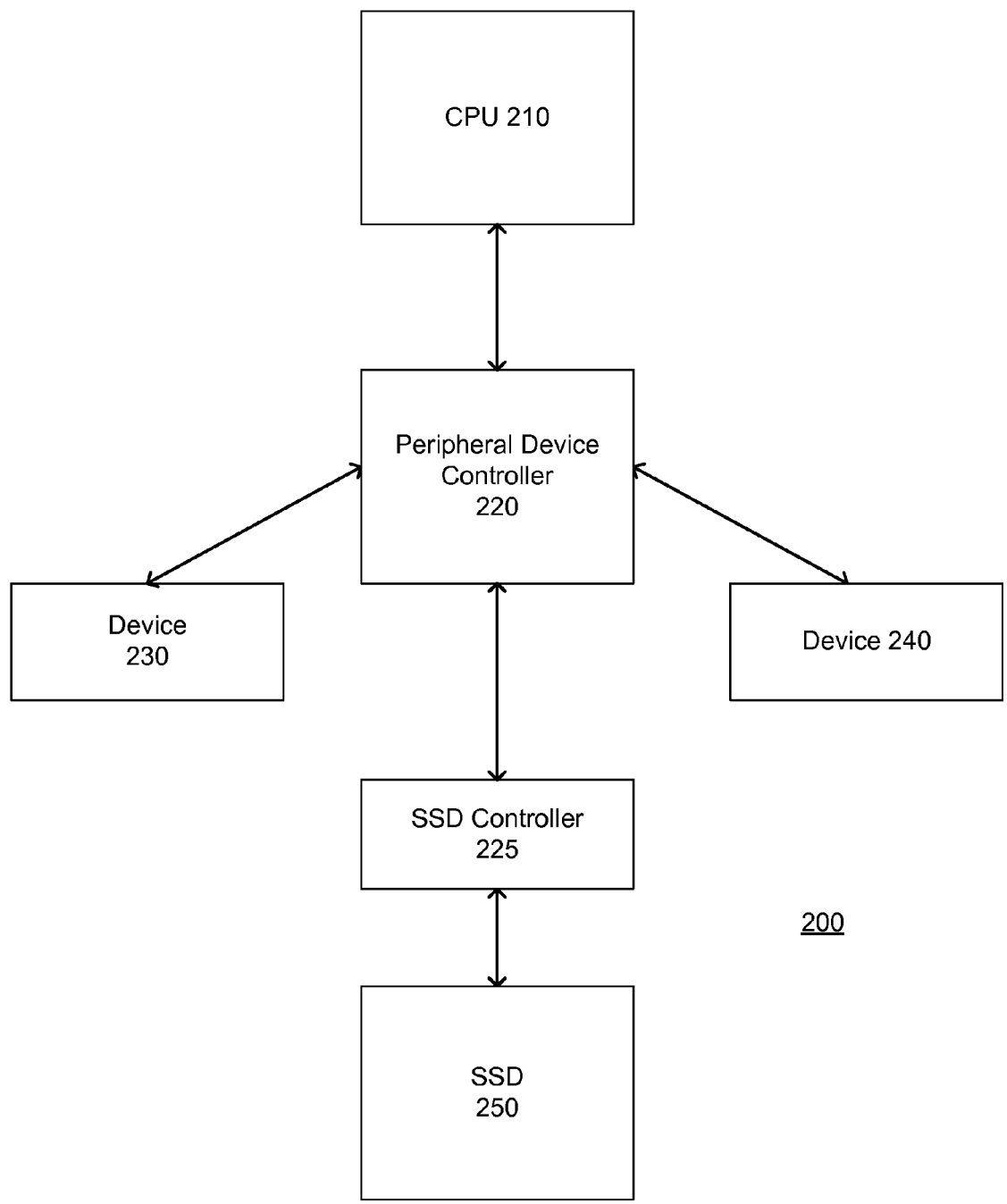
FIG. 2 is a block diagram of selected system components interacting with an embodiment of the invention.

FIG. 2 is a block diagram of selected system components interacting with an embodiment of the invention. In this embodiment, subsystem 200 includes SSD 250 which includes at least one NAND memory unit. SSD 250 may be operatively coupled to peripheral device controller 220 (via SSD controller 225). Said device controller may comprise any combination of logic and/or modules to control multiple devices. In this embodiment, peripheral device controller 220 may directly control devices 230 and 240, interface with SSD controller 225, and act as an interface to CPU 210 for the peripheral devices.

SSD controller 225 may be responsible for managing the programming speed of SSD 250 based on information received from the device describing the storage fidelity and the programming attributes its NAND memory unit(s)—e.g., the runtime value of the program/erase cycle count, the RBER, or the progress of ongoing programming operations.

Thus, SSD controller 225 may adjust, "on the fly," the programming speed of SSD 250 based on its usage, instead of using the same programming speed throughout the life of the device as is done in the prior art.

In this embodiment, programming speed will move closer to pre-defined specifications (e.g., NAND OEM specifications) as the wear level or RBER of SSD 250 increases. For example, the characteristics of the programming voltage may move closer to pre-defined voltage specifications or SSD 250, or the programming operations may be executed closer to "completion" as the RBER increases. Thus, it is to be understood that in embodiments of the invention, the programming speed of SSD 250 will almost always be faster than prior art solutions, and will be at least as fast as the prior art during the end life of SSD 250. It is understood that the ECC employed by subsystem 200 will determine the limit of the adjustments that may be made to the programming speed of SSD 250—i.e., the speed of programming operations should not cause with an error rate that exceeds the provisioned capabilities of the ECC.

Figure 3:
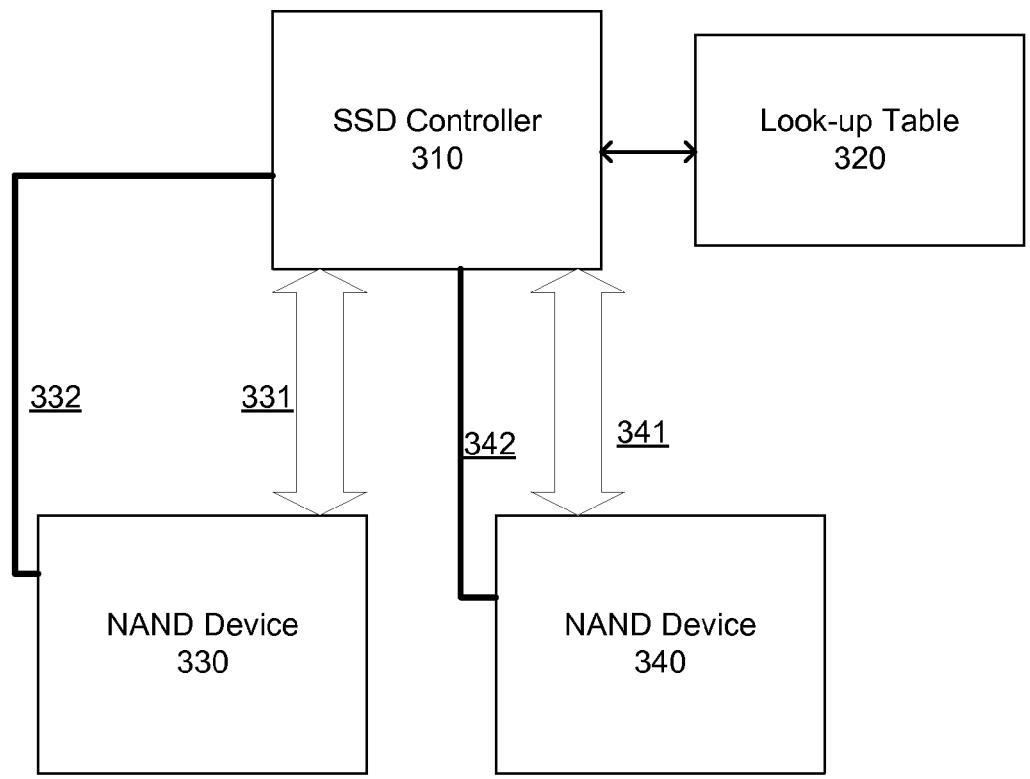
FIG. 3 is a block diagram of an SSD according to an embodiment of the invention.

FIG. 3 is a block diagram of an SSD including a plurality of NAND memory devices, according to an embodiment of the invention. In this embodiment, SSD 300 includes SSD controller 310 to manage the sensing, programming, and erasing of NAND memory devices 330 and 340 via data buses 331 and 341, respectively. SSD controller 310 further manages $\Delta V_{pgm}$ 332 applied to NAND memory device 330 and $\Delta V_{pgm}$ 342 applied to NAND memory device 340.

In this embodiment, SSD controller 310 accesses lookup table 320 to determine when and how to adjust the programming speed of devices 330 and 340 based on the storage fidelity of each device. Lookup table 320 may have, as indices, values of device factors that describe storage fidelity and have, as values corresponding to said indices, values of mechanisms that will increase the write speed of a NAND device. It is to be understood that while shown external to SSD controller 310, lookup table 320 may be included in said SSD controller in other embodiments of the invention.

For example, lookup table 320 may include at least one index corresponding to a programming attribute value, and at least one corresponding value describing an adjustment to programming voltages to be applied to the NAND memory devices in the host system. In one embodiment, the step size between program pulses for $V_{pgm}$ 332 and $V_{pgm}$ 342 are adjusted (i.e., $\Delta V_{pgm}$ 332 and $\Delta V_{pgm}$ 342) in order to increase the programming speed of said devices. In another embodiment, programming operations executed via buses 331 and 341 are exited "pre-maturely" in order to increase the programming speed of said devices.

It is understood that as the size of NAND memory device features decreases, the difference between the RBER at the "beginning of life" and the "end of life" will increase; therefore, it is understood that a finer granularity of adjustments to programming speed will produce a faster average programming speed for the lifespan of the respective device.

For example, a finer granularity of $\Delta V_{pgm}$ characteristics would require more threshold values to be stored in lookup table 320. Said lookup table may include several program/erase cycle counts as indices, wherein each index has a corresponding $\Delta V_{pgm}$ voltage level (i.e., a value above the voltage level to be used at the end of life). Although a larger $\Delta V_{pgm}$ may also expand the distribution of the threshold voltage and thus increase RBER, as long the adjustment of $\Delta V_{pgm}$ is not so large that the RBER increases beyond the RBER at the end of life, the host system ECC will provide enough protection. Thus, the system ECC as provisioned will maintain data integrity over the entire life cycle as long $\Delta V_{pgm}$ is adjusted accordingly.

The higher the program/erase cycle count, the lower the corresponding $\Delta V_{pgm}$ value. It is understood that when $\Delta V_{pgm}$ approaches its nominal value, the NAND memory device will operate according to device settings, and the ECC will no longer be "over-protecting" the device. Thus embodiments of the invention will fully utilize the error correction capability of the system ECC for the entire NAND memory device life instead of wasting its error correction capability at the beginning of life (as in current solutions).

It is to be understood that in other embodiments of the invention, lookup table 320 may include values that determine how "prematurely" programming operations may be exited in order to increase programming speed. In one embodiment, a byte counter that is used by SSD controller 310 is utilized to track the completion of write operations on devices 330 and 340; lookup table 320 may include byte counter values corresponding to quantifiable storage fidelity properties; thus, based on the storage fidelity of each device, an exit criteria for programming operations may be adjusted in order to cause a premature exit for write operations. In this case, an adjustable value of failing bytes will produce a faster average programming speed for the lifespan of the device.

Figure 4:
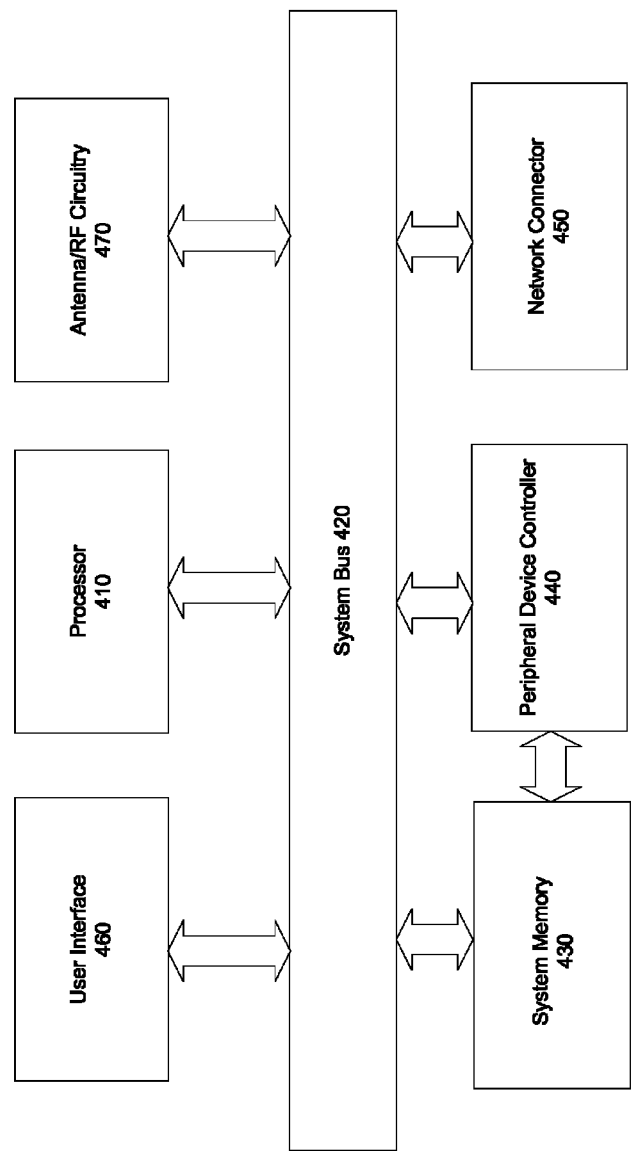
FIG. 4 is a block diagram of a system utilizing an embodiment of the invention.

FIG. 4 is block diagram of a system that may utilize an embodiment of the invention. System 400 may be included in, for example, a desktop computer, a laptop computer, a tablet computer, a netbook, a notebook computer, a personal digital assistant (PDA), a server, a workstation, a cellular telephone, a mobile computing device, an Internet appliance or any other type of computing device.

System 400 may include processor 410 to exchange data, via system bus 420, with user interface 460, system memory 430, peripheral device controller 440 and network connector 450. System memory 430 comprises volatile and non-volatile memory and may include any number of SSDs according to any of the above described embodiments of the invention wherein its programming speed may be adjusted. Thus, system 400 will have an increase in the performance for writes to system memory 430 compared to systems employing prior art system memory solutions.

System 400 may further include antenna and RF circuitry 470 to send and receive signals to be processed by the various elements of system 400. The above described antenna may be a directional antenna or an omni-directional antenna. As used herein, the term omni-directional antenna refers to any antenna having a substantially uniform pattern in at least one plane. For example, in some embodiments, said antenna may be an omni-directional antenna such as a dipole antenna, or a quarter wave antenna. Also for example, in some embodiments, said antenna may be a directional antenna such as a parabolic dish antenna, a patch antenna, or a Yagi antenna. In some embodiments, system 400 may include multiple physical antennas.

While shown to be separate from network connector 450, it is to be understood that in other embodiments, antenna and RF circuitry 470 may comprise a wireless interface to operate in accordance with, but not limited to, the IEEE 802.11 standard and its related family, Home Plug AV (HPAV), Ultra Wide Band (UWB), Bluetooth, WiMax, or any other form of wireless communication protocol.

Various components referred to above as processes, servers, or tools described herein may be a means for performing the functions described. Each component described herein includes software or hardware, or a combination of these. Each and all components may be implemented as software modules, hardware modules, special-purpose hardware (e.g., application specific hardware, ASICs, DSPs, etc.), embedded controllers, hardwired circuitry, hardware logic, etc. Software content (e.g., data, instructions, configuration) may be provided via an article of manufacture including a non-transitory, tangible computer or machine readable storage medium, which provides content that represents instructions that can be executed. The content may result in a computer performing various functions/operations described herein.

A computer readable non-transitory storage medium includes any mechanism that provides (i.e., stores and/or transmits) information in a form accessible by a computer (e.g., computing device, electronic system, etc.), such as recordable/non-recordable media (e.g., read only memory (ROM), random access memory (RAM), magnetic disk storage media, optical storage media, flash memory devices, etc.). The content may be directly executable ("object" or "executable" form), source code, or difference code ("delta" or "patch" code). A computer readable storage medium may also include a storage or database from which content can be downloaded. A computer readable medium may also include a device or product having content stored thereon at a time of sale or delivery. Thus, delivering a device with stored content, or offering content for download over a communication medium may be understood as providing an article of manufacture with such content described herein.

The invention claimed is:

1. A system comprising:
a NAND memory device; and
a controller operatively coupled to the NAND memory device to
determine a storage fidelity of the NAND memory device during operation of the NAND memory device, including a first a raw bit error rate (RBER) of the NAND memory device,
determine whether the first RBER of the NAND memory device is less than a second RBER, the second RBER comprising an expected RBER for an end-of-life storage fidelity state for the NAND memory device, and
adjust a programming speed characteristic of the NAND memory device, based on the storage fidelity of the NAND memory device, to increase the RBER of the NAND memory device in response to determining that the first RBER is less than the second RBER;
the NAND memory device to execute an error correction code (ECC) to correct bit errors that occur during a read operation of the NAND memory device, the ECC provisioned for the expected RBER for the end-of-life storage fidelity state of the NAND memory device.

2. The system of claim 1, wherein determining the storage fidelity of the NAND memory device is based, at least in part, on a program/erase cycle count of the NAND memory device.

3. The system of claim 1, wherein adjusting the programming speed characteristic of the NAND memory device is based, at least in part, on adjusting a voltage step size between programming voltage pulses applied to the NAND memory device.

4. The system of claim 1, wherein adjusting the programming speed characteristic of the NAND memory device is based, at least in part, on adjusting an exit criteria of programming operations to cause the NAND memory device to exit programming operations earlier to increase the RBER of the NAND memory device.

5. The system of claim 1, wherein adjusting the programming speed characteristic of the NAND memory device comprises
determining a programming attribute of the NAND memory device; and
accessing a lookup table that includes at least one index comprising a programming attribute value, and at least one corresponding value comprising a programming voltage characteristic value to be adjusted.

6. The system of claim 1, further comprising:
an antenna; and
radio frequency circuitry coupled to the antenna to receive signal data to be stored on the NAND memory device.

7. A method comprising:
determining a storage fidelity of a NAND memory device during operation of the NAND memory device, including a first raw bit error rate (RBER) of the NAND memory device, the NAND memory device to correct bit errors during a read operation via error correction code (ECC), the ECC provisioned for an expected RBER for an end-of-life storage fidelity of the NAND memory device;
determining whether the first RBER of the NAND memory device is less than a second RBER, the second RBER comprising the expected RBER for the end-of-life storage fidelity state for the NAND memory device; and
adjusting a programming speed characteristic of the NAND memory device, based on the storage fidelity of the NAND memory device, to increase the RBER of the NAND memory device in response to determining that the first RBER is less than the second RBER.

8. The method of claim 7, wherein determining the storage fidelity of the NAND memory device is based, at least in part, on a program/erase cycle count of the NAND memory device.

9. The method of claim 7, wherein adjusting the programming speed characteristic of the NAND memory device is based, at least in part, on adjusting a voltage step size between programming voltage pulses applied to the NAND memory device.

10. The method of claim 7, wherein adjusting the programming speed characteristic of the NAND memory device is based, at least in part, on adjusting an exit criteria of programming operations to cause the NAND memory device to exit programming operations earlier to increase the RBER of the NAND memory device.

11. The method of claim 7, wherein adjusting the programming speed characteristic of the NAND memory device comprises
determining a programming attribute of the NAND memory device; and
accessing a lookup table that includes at least one index comprising a programming attribute value, and at least one corresponding value comprising a programming voltage characteristic value to be adjusted.

12. A memory device comprising:
at least one NAND memory unit; and
a NAND memory unit controller to
determine a storage fidelity of the NAND memory unit(s) during operation of the NAND memory unit(s), including a first raw bit error rate (RBER) of the NAND memory unit(s), and
determine whether the first RBER of the NAND memory unit(s) is less than a second RBER, the second RBER comprising an expected RBER for an end-of-life storage fidelity state for the NAND memory unit(s), and
adjust a programming speed characteristic of the NAND memory unit(s), based on the storage fidelity of the NAND memory unit(s), to increase the RBER of the NAND memory unit(s) in response to determining that the first RBER is less than the second RBER;
the NAND memory unit(s) to execute an error correction code (ECC) to correct bit errors that occur during a read operation of the NAND memory unit(s), the ECC provisioned for the expected RBER for the end-of-life storage fidelity state of the NAND memory unit(s).

13. The memory device of claim 12, wherein the determining the storage fidelity of the NAND memory unit(s) is based, at least in part, on a program/erase cycle count of the NAND memory unit(s).

14. The memory device of claim 12, wherein adjusting the programming speed characteristic of the NAND memory unit(s) is based, at least in part, on adjusting a voltage step size between programming voltage pulses applied to the NAND memory unit(s).

15. The memory device of claim 12, wherein adjusting the programming speed characteristic of the NAND memory unit(s) is based, at least in part, on adjusting an exit criteria of programming operations to cause the NAND memory unit(s) to exit programming operations earlier to increase the RBER of the NAND memory unit(s).

16. The memory device of claim 12, wherein adjusting the programming speed characteristic of the NAND memory unit(s) comprises
determining a programming attribute of the NAND memory unit(s); and
accessing a lookup table that includes at least one index comprising a programming attribute value, and at least one corresponding value comprising a programming voltage characteristic value to be adjusted in order to adjust the programming speed characteristic of the NAND memory unit(s).

* * * * *